United States Patent
Yamashita et al.

(10) Patent No.: US 11,894,822 B2
(45) Date of Patent: Feb. 6, 2024

(54) FILTER DEVICE

(71) Applicant: Mitsubishi Electric Corporation, Tokyo (JP)

(72) Inventors: Yasutaka Yamashita, Tokyo (JP); Shigenori Tani, Tokyo (JP); Kazuma Kaneko, Tokyo (JP); Shigeru Uchida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/717,483

(22) Filed: Apr. 11, 2022

(65) Prior Publication Data
US 2022/0239283 A1    Jul. 28, 2022

Related U.S. Application Data

(63) Continuation of application No. PCT/JP2019/049224, filed on Dec. 16, 2019.

(51) Int. Cl.
*H03H 17/02* (2006.01)
*H03H 17/00* (2006.01)

(52) U.S. Cl.
CPC . *H03H 17/0227* (2013.01); *H03H 2017/0081* (2013.01)

(58) Field of Classification Search
None
See application file for complete search history.

(56) References Cited

U.S. PATENT DOCUMENTS 5,128,886 A    7/1992  Luthra
6,505,221 B1 *  1/2003  Maschmann ...... H03H 17/0219
                                                  708/319

FOREIGN PATENT DOCUMENTS

JP    3-46813 A       2/1991
JP    2009-129302 A   6/2009

OTHER PUBLICATIONS

Dandade et al. in "Review On Design Of Digital FIR Filters" in International Research Journal of Engineering and Technology (IRJET), vol. 4 Issue 2, Feb. 2017, https://www.irjet.net/archives/V4/i2/IRJET-V4I271.pdf (Year: 2017).*

(Continued)

*Primary Examiner* — Emily E Larocque
*Assistant Examiner* — Carlo Waje
(74) *Attorney, Agent, or Firm* — Birch, Stewart, Kolasch & Birch, LLP

(57) ABSTRACT

A filter device includes: delay units serially connected to delay an input signal and output a delayed signal; multiplication units multiplying the delayed signal by a filter coefficient based on a predetermined value and a multiplying factor adjustment value; a coefficient adjustment unit that, when a multiplication result obtained by multiplying the predetermined value by the multiplying factor adjustment value exceeds a maximum value of a filter-coefficient representation range, divides the multiplication result exceeding the maximum value by the maximum value, and outputs a quotient of division as a coefficient adjustment value; a signal conversion unit outputting a signal obtained by adding after-filter-coefficient-multiplication signals outputted by the multiplication units and an adjusted signal obtained by adjusting a corresponding delayed signal using the coefficient adjustment value; and a division unit generating an output signal by dividing the signal outputted by the signal conversion unit by the multiplying factor adjustment value.

8 Claims, 3 Drawing Sheets

(56) References Cited

OTHER PUBLICATIONS

Gross et al., "Stochastic Computing: Techniques and Applications (Tutorial on Stochastic Computing)," Springer, 2019, pp. 39-49 (total 8 pages).
Joe et al., "Notes on generating Sobol sequences," 2008, pp. 1-3.

* cited by examiner

FILTER DEVICE

CROSS-REFERENCE TO RELATED APPLICATION

This application is a continuation application of International Application PCT/JP2019/049224, filed on Dec. 16, 2019, and designating the U.S., the entire contents of which are incorporated herein by reference.

BACKGROUND OF THE INVENTION

1. Field of the Invention

The present disclosure relates to a filter device that filters a digital signal.

2. Description of the Related Art

A finite impulse response filter (hereinafter referred to as an FIR filter) is a kind of a digital filter, which convolves an input signal with filter coefficients and outputs a resultant signal obtained by the convolution.

In digital filters, quantization noise and computation error have been known to be a cause for deterioration in filter characteristics.

The quantization noise has a problem that the noise increases as the length of a filter increases. Regarding this problem, Japanese Patent Application Laid-open No. H3-46813 describes an inventive technique for reducing the quantization noise of filter coefficients. In the inventive technique described in Japanese Patent Application Laid-open No. H3-46813, each filter coefficient of the digital filter is multiplied by an adjustment multiplying factor value to make adjustment, and input data is multiplied by the filter coefficients obtained after the adjustment. Next, the input data having been multiplied by the adjusted filter coefficients is divided by the multiplicand, thereby to reduce the error caused by the rounding of the filter coefficients of the long digital filter.

In some cases, however, the inventive technique described in Japanese Patent Application Laid-open No. H3-46813 cannot sufficiently reduce the computation error. Below is a detailed description of this issue.

Consider the conventional FIR filter illustrated in No. 4 of Japanese Patent Application Laid-open No. H3-46813. For convenience of explanation, the input signal to the FIR filter is denoted by x(n), the output signal is denoted by y(n), and each filter coefficient is denoted by $h_n$ (n=0, 1, . . . , N−1). The input signal x(n) and each filter coefficient $h_n$ contain their respective quantization noises. Let $em_k$ represent the computation error caused through multiplication of the input signal x(n) and the k-th filter coefficient $h_k$, and $ea_k$ represent the error caused through addition thereof, then the output signal y(n) is expressed by the following equation (1).

[Formula 1]

$$y(n) = \sum_{k}^{N-1}(h_k x(n-k) + em_k + ea_k) \quad (1)$$
$$= y_0(n) + \sum_{k}^{N-1} em_k + \sum_{k}^{N-1} ea_k$$

In order to correct the error caused by the rounding of filter coefficients as in the inventive technique described in Japanese Patent Application Laid-open No. H3-46813, when the k-th filter coefficient $h_k$ is subjected to preliminary multiplying factor adjustment with $c_k$ and then divided by $c_k$, the output signal y(n) is expressed by the following equation (2).

[Formula 2]

$$y(n) = \sum_{k}^{N-1}\left(\frac{1}{c_k}(c_k h_k x(n-k) + em_k) + ea_k\right) \quad (2)$$
$$= y_0(n) + \sum_{k}^{N-1} \frac{1}{c_k} em_k + \sum_{k}^{N-1} ea_k$$

When the filter coefficient $h_k$ has a relatively large value among all the filter coefficients ($h_0$, $h_1$, . . . , $h_{N-1}$), if the range in which the filter coefficient is represented is small, then the value $c_k$ for the preliminary multiplying factor adjustment cannot have a large value, and the second term representing the computation error caused by multiplication in the equation (2) does not have a small value. That is, the computation error cannot be satisfactorily reduced.

SUMMARY OF THE INVENTION

In order to solve the above-mentioned problems and achieve the object, the present disclosure provides a filter device comprising: a plurality of delayers connected in series to delay an input signal in response to reception of the input signal and to output a delayed signal; a plurality of multipliers to multiply the delayed signal by a filter coefficient generated based on a predetermined value and a multiplying factor adjustment value; a coefficient adjuster to, when a multiplication result obtained by multiplying the predetermined value by the multiplying factor adjustment value exceeds a maximum value of a representation range of the filter coefficient, divide the multiplication result exceeding the maximum value by the maximum value, and output a quotient of the division as a coefficient adjustment value; a signal converter to output a signal obtained by adding after-filter-coefficient-multiplication signals outputted by the plurality of multipliers and an adjusted signal obtained by adjusting a corresponding delayed signal using the coefficient adjustment value; and a divider to generate an output signal by dividing the signal outputted by the signal converter by the multiplying factor adjustment value.

DETAILED DESCRIPTION OF THE PREFERRED EMBODIMENTS

Hereinafter, a filter device according to embodiments of the present disclosure will be described in detail with reference to the drawings. It is noted that the present disclosure is not necessarily limited by these embodiments.

First Embodiment

Figure 1:
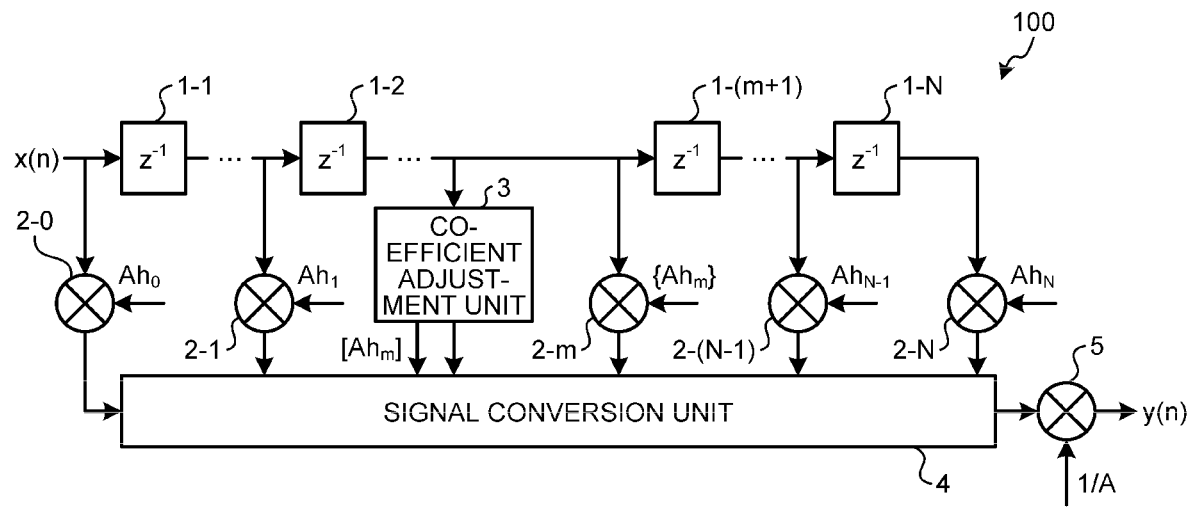
FIG. 1 is a diagram illustrating an exemplary circuit configuration of a filter device according to a first embodiment of the present disclosure.

FIG. 1 is a diagram illustrating an exemplary circuit configuration of a filter device according to the first embodiment of the present disclosure. The filter device 100 according to the first embodiment is a digital filter, specifically, an FIR filter. In a case where the filter device 100 is implemented by dedicated hardware, the filter device 100 is realized by, for example, a single circuit, a composite circuit, a programmed processor, a parallel programmed processor, an application specific integrated circuit (ASIC), a field programmable gate array (FPGA), or any combination thereof.

As illustrated in FIG. 1, the filter device 100 includes a plurality of delay units or delayers 1-1 to 1-N that delay an n-bit input signal by a predetermined time, multiplication units or multipliers 2-0 to 2-N that multiply an input signal to the filter device 100 and delayed signals that are signals respectively outputted from the delay units 1-1 to 1-N by filter coefficients corresponding to these signals, a coefficient adjustment unit or adjuster 3 that uses the m-th (m is one or more integers of [0 to N]) delayed signal, i.e. the delayed signal outputted from the delay unit or delayer 1-$m$ as an input and makes outputs for a signal conversion unit or converter 4 (described later), the signal conversion unit 4 that performs representation conversion by adding the signals from the multiplication units 2-0 to 2-N and the multiplication signal of the signals outputted from the coefficient adjustment unit 3, and a division unit or divider 5 that divides the output signal from the signal conversion unit 4 by the multiplicand. The multiplication signal of the signals outputted from the coefficient adjustment unit 3 means a signal that is obtained by multiplying the signals outputted from the coefficient adjustment unit 3 together.

The delay units 1-1 to 1-N are connected in series, and the signal x(n) is inputted to the delay unit 1-1. The delayed signals outputted by the delay units 1-1 to 1-(N−1) are respectively input to the delay units 1-2 to 1-N in their subsequent stages, and are also inputted to the multiplication units 2-1 to 2-(N−1), respectively. The delayed signal outputted by the delay unit 1-N is inputted to the multiplication unit 2-N. The multiplication unit 2-0 receives the signal x(n). The multiplication units 2-0 to 2-N receive their corresponding filter coefficients in addition to the above signals.

Here, each filter coefficient by which the input signal x(n) or a delayed signal is multiplied is a value generated based on a pre-designed value (hereinafter referred to as a design value) $h_0, h_1, \ldots, h_N$ and a multiplying factor adjustment value A. More specifically, each filter coefficient is a value obtained by multiplying a predetermined design value by the multiplying factor adjustment value, or a value calculated based on a value obtained by multiplying a design value by the multiplying factor adjustment value. That is, the value of each filter coefficient is $Ah_0, Ah_1, \ldots, Ah_N$ or a value calculated based thereon. In the present embodiment, when a first value obtained by multiplying a design value by the multiplying factor adjustment value is less than or equal to a maximum value $C_{max}$ of the representation range of the filter coefficient, the first value is used as the filter coefficient. When the first value exceeds the maximum value $C_{max}$, a second value calculated based on the first value is used as the filter coefficient. Specifically, when the value of the m-th coefficient exceeds the maximum value $C_{max}$ of the representation range of the filter coefficient through the multiplication of the design value by the multiplying factor adjustment value A, $\{Ah_m\}=Ah_m \% C_{max}$ is inputted to the multiplication unit or multiplier 2-$m$ as a filter coefficient by which the m-th delayed signal is multiplied. Here, $Ah_m \% C_{max}$ is the remainder of $Ah_m \div C_{max}$. That is, when the first value $Ah_m$ exceeds the maximum value $C_{max}$, the first value $Ah_m$ is divided by the maximum value $C_{max}$ to obtain a remainder that is the second value, and the obtained remainder is used as a filter coefficient. Note that when the first value $Ah_m$ is less than or equal to the maximum value $C_{max}$, the remainder of $Ah_m \div C_{max}$ is equal to the first value $Ah_m$. Therefore, it can be said that every filter coefficient is the remainder obtained by multiplying a design value by the multiplying factor adjustment value and dividing a resultant value of the multiplication by the maximum value $C_{max}$ of the representation range of the filter coefficient.

The coefficient adjustment unit 3 outputs, to the signal conversion unit 4, the m-th delayed signal inputted from the delay unit 1-$m$ and the coefficient adjustment value $[A_{hm}]=Ah_m/C_{max}$. Note that the coefficient adjustment value [Ahm] is an integer. That is, the coefficient adjustment value $[Ah_m]$ is the quotient of $Ah_m \div C_{max}$. Accordingly, the coefficient adjustment unit 3 may comprise a division unit prompted to output the division result $(Ah_m \div C_{max})$ when $Ah_m$ is greater than $C_{max}$.

Figure 2:
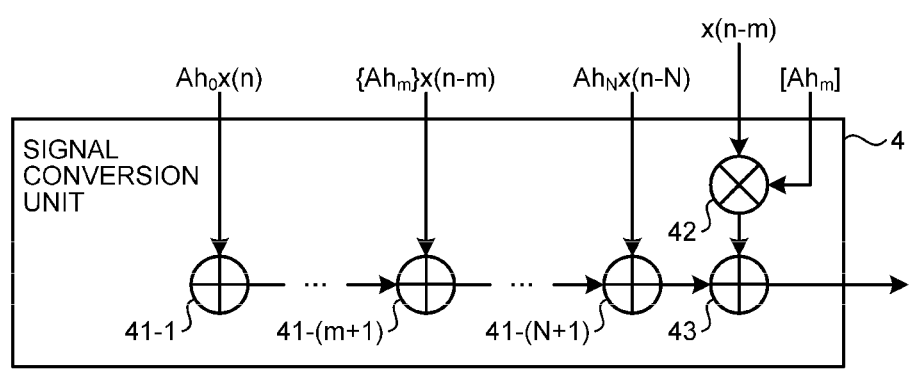
FIG. 2 is a diagram illustrating an exemplary configuration of a signal conversion unit provided in the filter device according to the first embodiment.

The signal conversion unit 4 will be described. FIG. 2 is a diagram illustrating an exemplary configuration of the signal conversion unit 4 provided in the filter device 100 according to the first embodiment.

The signal conversion unit 4 includes addition units or adder 41-1 to 41-(N+1) that use the outputs from the multiplication units 2-0 to 2-N as inputs thereof and add them while increasing the bit length. The addition unit or adder 41-$k$ (k=2, 3, 4, ..., N+1) adds the signal outputted by the addition unit or adder 41-($k$−1) and the signal outputted by the multiplication unit or multiplier 2-$k$. In addition, the signal conversion unit 4 includes a multiplication unit or multiplier 42 that generates an adjusted signal by multiplying the m-th delayed signal x(n) and the coefficient adjustment value $[Ah_m]$ outputted from the coefficient adjustment unit 3 with the bit length being increased, and an addition unit or adder 43 that adds the output of the addition unit 41-(N+1) and the output of the multiplication unit 42. The number of multiplication units 42 and the number of addition units 43 are each not limited to one, and it is contemplated that that number may be greater than or equal to the number of filter coefficients exceeding the representation range through the multiplication of the multiplying factor adjustment value A. In this way, the signal conversion unit 4 obtains an output represented by the following expression (3).

[Formula 3]

$$Ah_0 x(n)+Ah_1 x(n-1)+ \ldots +\{Ah_m\}x(n-m)+ \ldots + Ah_N x(n-N)+[Ah_m]x(n-m) \quad (3)$$

Alternatively, another configuration may be used in which the coefficient adjustment unit 3 makes the same number of copies of the m-th delayed output as the coefficient adjustment value $[Ah_m]$ and outputs the copies to the signal conversion unit 4, thereby to perform only addition without the need for multiplication in the signal conversion unit 4.

The division unit 5 divides the output of the signal conversion unit 4 represented by the expression (3) by the multiplicand, namely the above-mentioned multiplying factor adjustment value A, and performs rounding such that the result has substantially the same bit length as x(n), thereby generating the output signal y(n) of the filter device 100 represented by the following equation (4).

[Formula 4]
$$y(n) = \sum_{k=0}^{N-1} h_k x(n-k) \quad (4)$$

The division unit 5 can also be implemented by bit shift by setting the multiplying factor adjustment value A by which the filter coefficients are multiplied to a power of two.

By the above configuration, it is expected that the computation error associated with addition in the filter device 100 is minimized. At this time, only in terms of the computation error associated with multiplication, the output signal y(n) of the filter device 100 is represented by the following equation (5). In the equation (5), $em_k$ denotes the computation error associated with multiplication.

[Formula 5]
$$y(n) = \sum_{k}^{N-1}\left(\frac{1}{A}(Ah_k x(n-k) + em_k)\right) \quad (5)$$
$$= y_0(n) + \frac{1}{A}\sum_{k}^{N-1} em_k$$

As shown by the second term of the equation (5), division can be performed using the equal multiplying factor adjustment value A with respect to the overall computation error, and thus the computation error can be reduced. In addition, because the values of the filter coefficients multiplied by the multiplying factor adjustment value A are allowed to exceed the maximum value of the representation range, it is possible to improve the filter characteristics while keeping the quantization bit rate low.

As described above, the filter device 100 according to the first embodiment includes two or more delay units 1-1 to 1-N that delay the input signal, the multiplication units 2-0 to 2-N that multiply the input signal x(n) and each of the delayed signals outputted from the delay units 1-1 to 1-N by the filter coefficients obtained by multiplying a design value by the multiplying factor adjustment value A, the coefficient adjustment unit 3 that generates a coefficient adjustment value based on the multiplying factor adjustment value A and the maximum value $C_{max}$ of the representation range when the filter coefficient exceeds the maximum value $C_{max}$ of the representation range, and outputs the generated coefficient adjustment value and the corresponding delayed signal, the signal conversion unit 4 that performs representation conversion by adding signals obtained by the filter coefficient multiplication outputted from the multiplication units 2-0 to 2-N and an adjusted signal obtained by multiplying the coefficient adjustment value outputted from the coefficient adjustment unit 3 and the delayed signal corresponding to this coefficient adjustment value, and the division unit 5 that divides the signal obtained by the representation conversion outputted from the signal conversion unit 4 by the multiplying factor adjustment value A. According to the filter device 100, it is possible to reduce the deterioration in filter characteristics possibly caused by the computation error.

Second Embodiment

Next, the filter device according to the second embodiment, specifically, the filter device implemented using stochastic computing will be described.

Stochastic computing is disclosed, for example, in the literature "Warren J. Gross and Vincent C. Gaudet Editors, 'Stochastic Computing: Techniques and Applications'".

Stochastic computing is characterized by its effectiveness in reducing the circuit scale of product-sum operation, and the filter device can be downsized by being configured using stochastic computing. In other hand, in stochastic computing, a numerical value is expressed by the existence probability of zero and one in a bitstream generated using a random number sequence, so that the correlation in the random number sequence between numerical values inputted to the computing circuit becomes a cause of the computation error. Reducing this computation error is the problem to be considered when stochastic computing is used.

Figure 3:
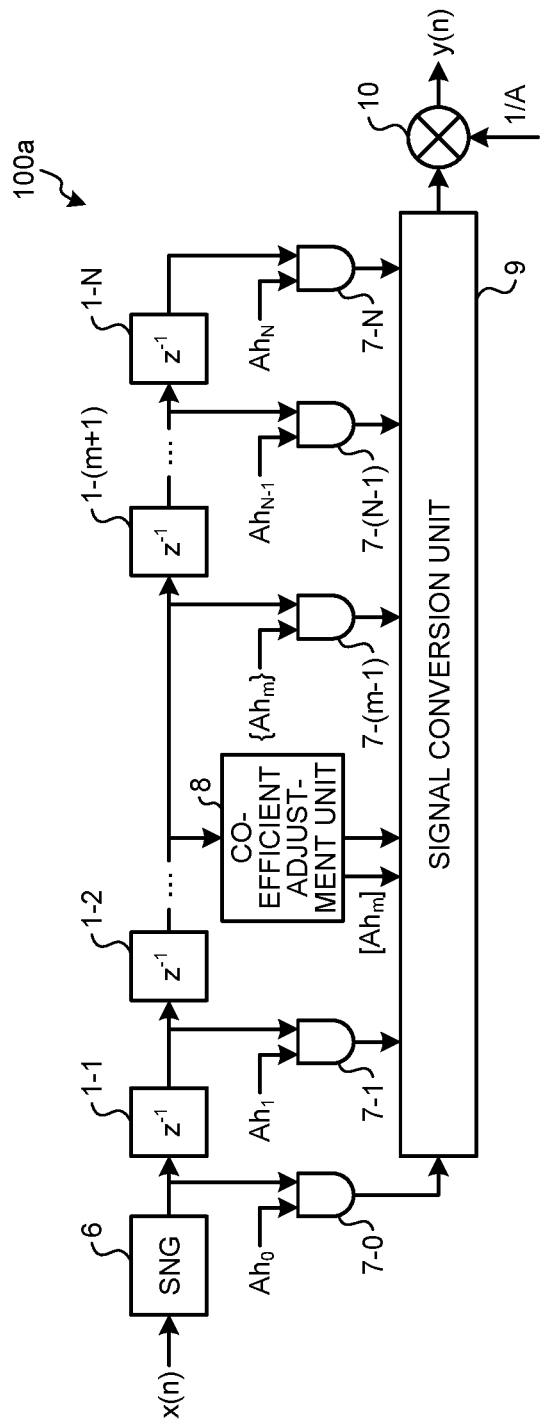
FIG. 3 is a diagram illustrating an exemplary circuit configuration of a filter device according to a second embodiment of the present disclosure.

FIG. 3 is a diagram illustrating an exemplary circuit configuration of a filter device 100*a* according to the second embodiment. The filter device 100*a* according to the second embodiment includes a representation conversion unit or converter 6 (denoted by SNG (which stands for stochastic number generator) 6 in FIG. 3) that converts the n-bit input signal x(n) in binary notation into stochastic representation, two or more delay units 1-1 to 1-N that delay the input signal from the representation conversion unit 6 by their predetermined times, multiplication units or multipliers 7-0 to 7-N that multiply the input signal from the representation conversion unit 6 and the delayed signals outputted from the delay units 1-1 to 1-N by the filter coefficients corresponding to these signals, a coefficient adjustment unit or adjuster 8 that uses the m-th delayed signal as its input and makes output to a signal conversion unit or converter 9 (described later), the signal conversion unit 9 that performs representation conversion by adding the signals from the multiplication units 7-0 to 7-N and the multiplication signal of the signals outputted from the coefficient adjustment unit 8, and a division unit or divider 10 that divides the output signal from the signal conversion unit 9 by the multiplicand. The stochastic-representation signal outputted by the representation conversion unit 6 is inputted to the leading delay unit 1-1 of the delay units 1-1 to 1-N.

Figure 4:
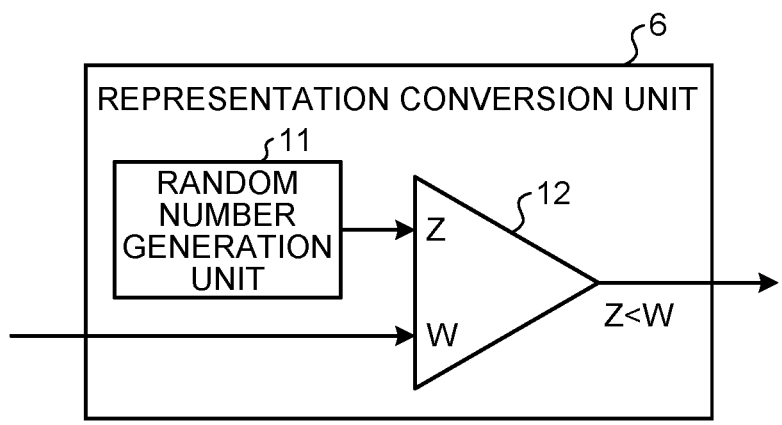
FIG. 4 is a diagram illustrating an exemplary configuration of a representation conversion unit provided in the filter device according to the second embodiment.

The representation conversion unit 6 will be described. FIG. 4 is a diagram illustrating an exemplary configuration of the representation conversion unit 6 provided in the filter device 100*a* according to the second embodiment.

The representation conversion unit 6 includes a random number generation unit or generator 11 that generates random numbers, and a comparator 12 that compares the input value to the representation conversion unit 6, namely the input signal x(n) to the filter device 100*a*, with the random number value inputted from the random number generation unit 11. The comparator 12 has a terminal Z to which the random number value is inputted, and a terminal W to which the signal x(n) is inputted.

The comparator 12 outputs one when the binary-representation input value is larger than the random number value inputted from the random number generation unit 11, but outputs zero when the input value is less than or equal to the random number value. With such a configuration, for example, if the bit length (hereinafter referred to as SN length) used for stochastic representation is 10 bits, the input value is 0.3, and the random number value is uniform random numbers in a range between 0 and 1, then the resultant stochastic-representation value with the highest expected value corresponds to a number sequence in which 3 bits out of 10 bits have 1 and the remaining 7 bits have 0. The representation conversion unit 6 operates in this manner. The representation conversion unit 6 may be configured to generate stochastic-representation values corresponding to binary-representation values in advance, hold them in a memory as a table, and read the value corresponding to the input value directly from the memory.

The after-conversion input signal in stochastic representation and the delayed signals in stochastic representation obtained by delaying the after-conversion input signal in stochastic representation in the delay units 1-1 to 1-N are multiplied by the corresponding filter coefficients in the multiplication units 7-0 to 7-N. The filter coefficients to be used in this process also need to be converted into stochastic representation. The filter coefficients $Ah_0$, $Ah_1$, . . . , $\{Ah_{0m}\}$, . . . , $Ah_{N-1}$, and $Ah_N$ illustrated in FIG. 3 are values already converted into stochastic representation in advance. Alternatively, a circuit equivalent to the representation conversion unit 6 may be provided separately as a coefficient conversion unit or converter that converts the filter coefficients into stochastic representation.

In FIG. 3, the multiplication units 7-0 to 7-N are expressed by AND operation, and this expression belongs to the case of unipolar representation with a stochastic representation range being set to 0 to 1. Instead, in the case of bipolar representation with a stochastic representation range being set to −1 to 1, the multiplication units 7-0 to 7-N are expressed by XNOR operation. These operations are realized by a lookup table (LUT) on an FPGA, for example.

The coefficient adjustment unit 8 outputs, to the signal conversion unit 9, the m-th delayed signal inputted from the delay unit 1-$m$ and the coefficient adjustment value $[Ah_m]=Ah_m/C_{max}$, in substantially the same manner as the coefficient adjustment unit 3 of the filter device 100 according to the first embodiment.

The signal conversion unit 9 performs parallel addition using the outputs from the multiplication units 7-0 to 7-N and the outputs from the coefficient adjustment unit 8 as inputs. In this example, the parallel addition divides the number of "1" included in all the input stochastic-representation values by the SN length, thereby to obtain the output value represented in binary notation. For example, if the SN length is 10 and the input stochastic-representation values are three values, i.e., "0000100100" (0.2), "1010111110" (0.7), and "0010101111" (0.6), then 15 that is the number of "is" is divided by the SN length of 10, and so 1.5 is obtained as the output value. By performing parallel addition through the above operation, the output represented in binary notation is obtained.

The division unit 10 divides the output of the signal conversion unit 9 by the multiplicand, namely the above-mentioned multiplying factor adjustment value A, and performs rounding such that the result has the same bit length as x(n), thereby to generate the output signal y(n) of the filter device 100 represented by the following equation (6).

[Formula 6]

$$y(n) = \sum_{k=0}^{N-1} h_k x(n-k) \qquad (6)$$

The division unit 10 can also be realized by bit shift in which the multiplying factor adjustment value A by which filter coefficients are multiplied is set to a power of two, in substantially the same manner as the division unit 5 of the filter device 100 according to the first embodiment.

The above configuration makes it possible to reduce a computation error because a computation error associated with parallel addition is only caused in the division of the number of "1s" by the SN length. In particular, because it is necessary to double the SN length in order to double the resolution in stochastic representation, it is possible to reduce the circuit scale by reducing the SN length, and also to reduce the deterioration in filter characteristics due to computation error as in the first embodiment. Further, because the multiplication units 7-1 to 7-N can be implemented by simple circuitry, the overall circuit scale can be reduced.

Third Embodiment

In the filter device of a configuration according to the second embodiment, errors in stochastic representation are classified as conversion errors derived from conversion into stochastic representation and correlation errors derived from the correlation between random number sequences used for converting each input into stochastic representation during computation. The present embodiment describes a configuration for reducing a conversion error and a correlation error.

The conversion error occurs when a random number sequence is biased. For example, suppose that the representation conversion unit 6 of FIG. 4 expresses the range of 0 to 1 by stochastic representation with the SN length of 10. In this case, in order to convert the value 0.6 into stochastic representation, it is desirable that the random number generation unit 11 outputs uniform values, for example, 6 values that are each smaller than or equal to 0.6 and 4 values that are each larger than 0.6. However, the pseudo-random number generator has a biased output distribution caused, which increases the conversion error.

In addition, a computation error is derived from the correlation between random number sequences used for converting each of inputs to the computation units into stochastic representation. In the configuration described in the second embodiment, the computation error associated with parallel addition is small. Therefore, a method for reducing a computation error in the multiplication units will be described below.

In the filter device 100$a$ with the configuration of the second embodiment, as the correlation between random number sequences for converting, into stochastic representation, delayed signals and filter coefficients which are inputs to the multiplication units 7-0 to 7-N gets larger, the error is larger. Therefore, in order to reduce the computation error, random number sequences used for converting each delayed signal and each filter coefficient into stochastic representation need to have a small correlation.

An effective way to achieve this objective is, for example, to use ultra-uniform distribution sequences such as Sobol sequences as the random number sequences generated by the random number generation unit 11 of the representation conversion unit 6 and the random number sequences for converting filter coefficients into stochastic representation. Sobol sequences may be realized by sequentially reading out them from a conversion table, or may be realized in a method disclosed in the literature "'Notes on generating Sobol sequences', Stephen Joe and Frances Y. Kuo, August 2008", for example.

In addition, in a case where an ultra-uniform distribution sequence can be selected from among multiple sequences, it is effective to select two sequences that make the multiplication error smaller, and use one of the two for the representation conversion of a delayed signal and the other for the representation conversion of a filter coefficient.

The above configuration makes it possible to reduce the conversion error associated with conversion into stochastic representation, and to further reduce the computation error associated with multiplication.

The filter device according to the present disclosure has an advantageous effect that it can reduce the deterioration in filter characteristics due to a computation error.

The configurations described in the above-mentioned embodiments show examples of the contents of the present disclosure, and can each be combined with other publicly known techniques and partially omitted and/or modified without departing from the scope of the present disclosure.

What is claimed is:

1. A Finite Impulse Response (FIR) filter device comprising:
   a plurality of delayers connected in series to delay an input signal in response to reception of the input signal and to output a delayed signal;
   a plurality of multipliers to multiply the delayed signal by a filter coefficient generated based on a predetermined value and a multiplying factor adjustment value;
   a first divider which, when a multiplication result obtained by multiplying the predetermined value by the multiplying factor adjustment value exceeds a maximum value of a representation range of the filter coefficient, is prompted by logical circuitry in the FIR filter device to divide the multiplication result exceeding the maximum value by the maximum value, and output a quotient of the division as a coefficient adjustment value;
   a plurality of adders interconnected to output a signal obtained by adding after-filter-coefficient-multiplication signals outputted by the plurality of multipliers and an adjusted signal obtained by adjusting a corresponding delayed signal using the coefficient adjustment value; and
   a second divider to generate an output signal by dividing the signal outputted by the plurality of adders by the multiplying factor adjustment value, the output signal being a digitally filtered representation of the input signal.

2. The FIR filter device according to claim 1, wherein a remainder obtained by dividing the multiplication result by the maximum value is used as the filter coefficient.

3. The FIR filter device according to claim 1, further comprising:
   another multiplier to output the adjusted signal by multiplying the corresponding delayed signal by the coefficient adjustment value.

4. The FIR filter device according to claim 1, wherein the multiplying factor adjustment value is set to a power of two, and
   division processing performed by the second divider is implemented by bit shift.

5. The FIR filter device according to claim 1, further comprising
   a comparator to compare an input signal to a random number value to convert the input signal into a stochastic-representation signal to be inputted to a leading delayer of the plurality of delayers, wherein
   the filter coefficient is, or is converted to, a stochastic-representation filter coefficient, and
   the first divider and the plurality of adders perform computation processing on the stochastic-representation signal.

6. The FIR filter device according to claim 5, further comprising
   another comparator to compare the filter coefficient to another random number value to convert the filter coefficient into the stochastic-representation filter coefficient.

7. The FIR filter device according to claim 5, wherein the comparator converts the input signal into the stochastic-representation signal by comparing the input signal to an ultra-uniform distribution sequence generated as the random number value.

8. The FIR filter device according to claim 5, further comprising
   another comparator to compare the filter coefficient to another random number value to convert the filter coefficient into the stochastic-representation filter coefficient wherein an ultra-uniform distribution sequence is generated as the another random number value.

* * * * *